(12) United States Patent
Mattia

(10) Patent No.: US 10,305,487 B1
(45) Date of Patent: May 28, 2019

(54) NOR LOGIC GATE WITH DATA-INDEPENDENT DELAY

(71) Applicant: IQ-Analog Corporation, San Diego, CA (US)

(72) Inventor: Oscar Elisio Mattia, San Diego, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

(21) Appl. No.: 16/194,300

(22) Filed: Nov. 17, 2018

(51) Int. Cl.
*H03K 19/094* (2006.01)
*H03K 19/21* (2006.01)
*H03K 19/173* (2006.01)

(52) U.S. Cl.
CPC ......... *H03K 19/21* (2013.01); *H03K 19/1733* (2013.01)

(58) Field of Classification Search
CPC ..... H03K 19/0944; H03K 2005/00215; H03K 2017/6878
See application file for complete search history.

(56) References Cited

U.S. PATENT DOCUMENTS

| | | | | |
|---|---|---|---|---|
| 6,043,675 A * | 3/2000 | Miyamoto | ............ | G06F 7/5013 326/11 |
| 6,323,687 B1 * | 11/2001 | Yano | ................ | H03K 19/00384 326/27 |
| 6,731,134 B1 * | 5/2004 | Bucossi | ............ | H03K 19/09429 326/121 |
| 7,511,534 B1 * | 3/2009 | Bringivijayaraghavan | | ................. H03K 19/0005 326/83 |
| 2008/0218200 A1 * | 9/2008 | Tam | .................... | H03K 19/0944 326/34 |
| 2016/0301365 A1 * | 10/2016 | Jacquemod | ........ | H03K 19/0013 |

OTHER PUBLICATIONS

J. Rabaey, A. Chandrakasan. B. Nikolic. Digital Integrated Circuit: A Design Perspective. 2nd edition, 2003.
R. Jacob Baker. CMOS Circuit Design, Layout and Simulation. IEEE Press & Wiley, 2005.

* cited by examiner

*Primary Examiner* — Alexander H Taningco
*Assistant Examiner* — Kurtis R Bahr
(74) *Attorney, Agent, or Firm* — Law Office of Gerald Maliszewski; Gerald Maliszewski

(57) ABSTRACT

Devices and methods are presented for supplying logic gate signals with a data-independent delay. The method provides a logic gate comprising a pull-up network connected to a pull-down network. The method supplies binary level digital data input signals to the pull-up network and pull-down network, which may be either single-ended or complementary. The pull-up network and pull-down network regulate current through the logic gate with a delay and impedance independent of the data signals. As a result, the logic gate supplies binary level digital logic output signals in response to the data input signals, with a uniform delay. For example, the logic gates may be one of the following: NOR gate, NAND gate, AND gate, or OR gate.

6 Claims, 7 Drawing Sheets

NOR LOGIC GATE WITH DATA-INDEPENDENT DELAY

BACKGROUND OF THE INVENTION

1. Field of the Invention

This invention generally relates to integrated circuit (IC) digital logic gates and, more particularly, to logic gates having output logic signal delays that are independent of the input data signals.

2. Description of the Related Art

FIG. 1 depicts a complementary metal-oxide-semiconductor field-effect transistor (CMOS) NOR gate and associated truth table (prior art). Conventional CMOS gates have asymmetric pull-up/pull-down networks that lead to different output transition times, depending on the input switching pattern. Consider the NOR gate shown in FIG. 1, where the "R" values correspond to the transistor relative resistance when active. As shown in the truth table, when both "a" and "b" go high (1) the pull-down network presents an equivalent resistance that is half the resistance (R=−1) of the other transition resistance values (R=+2 or −2). The result is two different output signal (y) fall times. This issue is not limited to NOR gates, but is also relevant to OR gates, AND gates, and NAND gates. Further, asymmetric pull-up/pull-down networks lead to output signal delay disparities in other design technologies besides CMOS.

It would be advantageous if logic gate pull-up/pull-down networks could be designed to be independent of the input data patterns.

SUMMARY OF THE INVENTION

Disclosed herein are logic gate designs using pull-up and pull-down networks having uniform impedances that are independent of input data values, when enabled. As a result, the logic signal delays may be made uniform for every input data value combination. Static complementary metal-oxide-semiconductor field-effect transistor (CMOS) logic circuits are described in detail as examples to explain the design concept. However, the design concept is equally applicable to logic gates made using other technologies where the logic function is enabled using pull-up and pull-down networks.

Accordingly, a method is presented for supplying logic signals with a data-independent delay. The method provides a logic gate with a pull-up network connected to a pull-down network. The method supplies binary level digital data input signals to the pull-up network and pull-down network, which may have either single-ended or complementary inputs. The pull-up network and pull-down network regulate current through the logic gate with a delay and impedance that are independent of the data input signals. As a result, the logic gate supplies binary level digital logic output signals in response to the data input signals, with a uniform delay. For example, the logic gates may be a NOR gate, NAND gate, AND gate, or OR gate.

In the case of a NOR gate, all zero value data input signals may be supplied at a first time, and the NOR gate supplies a one value logic output signal with a first fall time delay after the first time. When at least a single one value data input signal, or all one values, are presented to the NOR gate at a second time, it supplies a zero value logic output signal with the first fall time delay after the second time. In one aspect, the method inverts the NOR gate logic signals to supply OR gate logic output signals with a uniform delay, independent of the data input signals.

Similarly, in the case of a NAND gate, with all one value data input signals at a first time the NAND gate supplies a zero value logic output signal with a first rise time delay after the first time. If at least a single zero value data input signal, or two one values, are presented to the NAND gate at a second time, it supplies a one value logic output signal with the first rise time delay after the second time. In one aspect, the method inverts the NAND gate logic output signals to supply AND gate logic output signals with a uniform delay, independent of the data input signals.

Also provided are logic integrated circuits (ICs) with data-independent delay. In general, each logic IC includes a pull-up network having an input to accept binary level digital data input signals, an output to supply binary level digital logic output signals responsive to the data input signals, and a current interface connected to a first reference voltage. Also included is a pull-down network having an input to accept the data input signals, a current interface connected to a second reference voltage having a lower potential than the first reference voltage, and an output connected to the output of pull-up network. The pull-up network and the pull-down network may act to maintain a uniform impedance between their respective outputs and current interfaces, independent of the data signals, when enabled.

In one specific example, the logic IC is a NOR gate. The pull-up network includes a first p-channel metal-oxide-semiconductor field-effect transistor (PMOS) having a first source/drain (S/D) connected to the first reference voltage, a gate to accept a first single-ended data input signal (a), and a second S/D. A second PMOS has a first S/D connected to the second S/D of the first PMOS, a gate to accept a second single-ended data input signal (b), and a second S/D connected to the output.

The pull-down network includes a first n-channel metal-oxide-semiconductor field-effect transistor (NMOS) with a first S/D connected to the output, a gate to accept the first data input signal, and a second S/D connected to the second reference voltage. A second NMOS has a first S/D connected to the output, a gate to accept the second data input signal, and a second S/D connected to the second reference voltage. A third PMOS has a first S/D connected to the output, a gate to accept the first data input signal, and a second S/D. A third NMOS has a first S/D connected to the second S/D of the third PMOS, a gate to accept the second data input signal, and a second S/D connected to the second reference voltage. A fourth PMOS has a first S/D connected to the output, a gate to accept the second data input signal, and a second S/D. A fourth NMOS has a first S/D connected to the second S/D of the fourth PMOS, a gate to accept the first data input signal, and a second S/D connected to the second reference voltage. The pull-down network creates uniform fall time delays in the logic output signals, responsive to the single-ended data input signals. In one aspect, an inverter is connected to the output of the pull-up network to accept the NOR logic output signals (y), and it has an output to supply single-ended OR logic output signals (y_bar).

Additional details of the above-described method, as well as other examples of other single-ended and complementary logic ICs are provided below.

DETAILED DESCRIPTION

Figure 2:
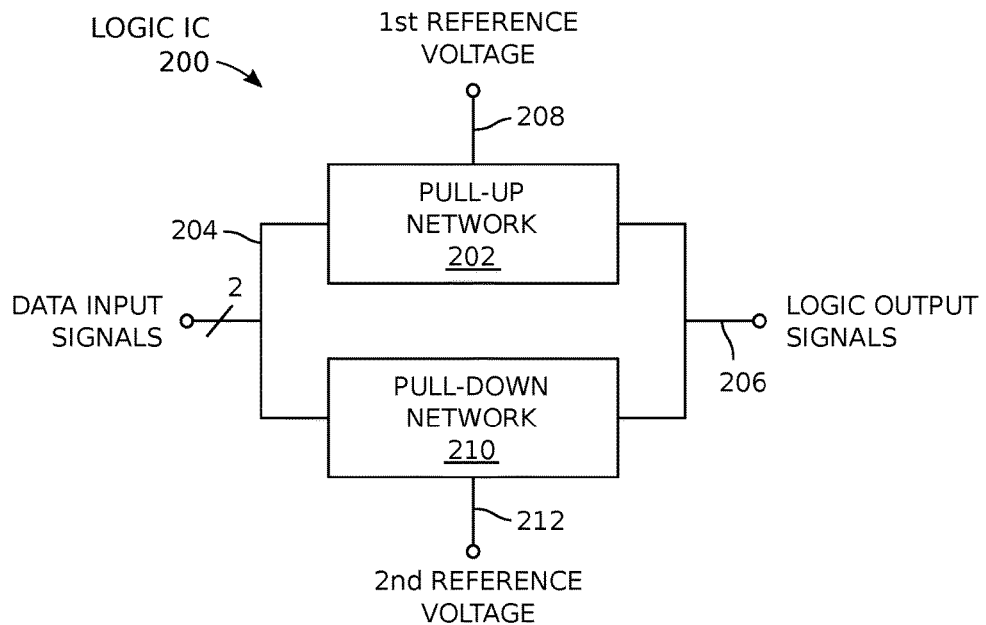
FIG. 2 is a schematic block diagram depicting a logic integrated circuit (IC) with data-independent delay.

FIG. 2 is a schematic block diagram depicting a logic integrated circuit (IC) with data-independent delay. The logic IC 200 comprises a pull-up network 202 having an input on line 204 to accept binary level digital data input signals, an output on line 206 to supply binary level digital logic output signals responsive to the data signals, and a current interface on line 208 connected to a first reference voltage (e.g., Vcc). A pull-down network 210 has an input on line 204 to accept the data input signals, a current interface on line 212 connected to a second reference voltage having a lower potential than the first reference voltage (e.g., ground), and an output on line 206 connected to the output of pull-up network. The pull-up network 202 and the pull-down network 210 may act to maintain a uniform impedance between their respective outputs on line 206 and current interfaces on lines 208 and 212, independent of the data signals, as explained in more detail below, when enabled. As used herein, "enabled" refers to a state when a pull-up or pull-down network has at least one transistor turned on (conducting current) so as to provide a relatively low impedance path between a respective reference voltage and the output on line 206. A transistor is "disabled" when it is turned off so as to provide a high impedance path. It should also be noted that the data input signals on line 204 include at least separate "a" and "b" data signals.

Figure 3:
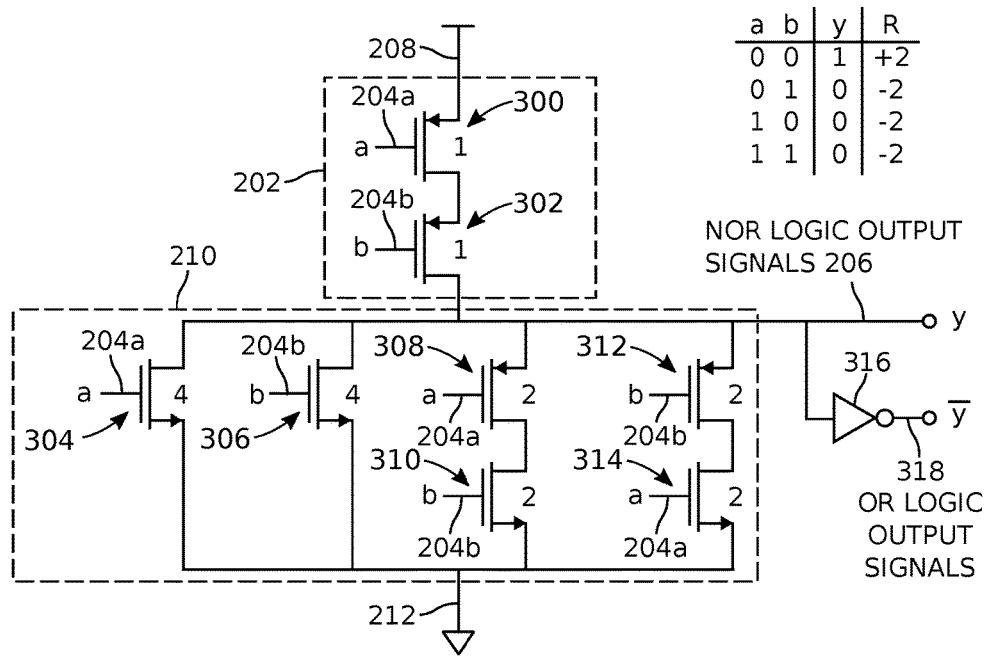
FIG. 3 is a schematic drawing of a single-ended input NOR gate with an associated truth table.

FIG. 3 is a schematic drawing of a single-ended input NOR gate with an associated truth table. In contrast to the conventional NOR gate depicted in FIG. 1, the NOR gate of FIG. 3 maintains a constant relative resistance value through the pull-down network 210 (R=−2) for all input data combinations, when the pull-down network transistors are in transition while being enabled. The pull-up network 202 comprises a first p-channel metal-oxide-semiconductor field-effect transistor (PMOS) 300 having a first source/drain (S/D) connected to the first reference voltage on line 208, a gate to accept a first single-ended data input signal (a) on line 204a, and a second S/D. A second PMOS 302 has a first S/D connected to the second S/D of the first PMOS, a gate to accept a second single-ended data input signal (b) 204b, and a second S/D connected to the output on line 206 to supply NOR logic output signals.

The pull-down network 210 comprises a first n-channel metal-oxide-semiconductor field-effect transistor (NMOS) 304 with a first S/D connected to the output on line 206, a gate to accept the first data input signal on line 204a, and a second S/D connected to the second reference voltage on line 212. A second NMOS 306 has a first S/D connected to the output on line 206, a gate to accept the second data input signal on line 204b, and a second S/D connected to the second reference voltage on line 212. A third PMOS 308 has a first S/D connected to the output on line 306, a gate to accept the first data input signal on line 204a, and a second S/D. A third NMOS 310 has a first S/D connected to the second S/D of the third PMOS, a gate to accept the second data input signal on line 204b, and a second S/D connected to the second reference voltage on line 212. A fourth PMOS 312 has a first S/D connected to the output on line 206, a gate to accept the second data input signal on line 204b, and a second S/D. A fourth NMOS 314 has a first S/D connected to the second S/D of the fourth PMOS, a gate to accept the first data input signal on line 204a, and a second S/D connected to the second reference voltage on line 212. The pull-down network 210 creates uniform fall time delays in the logic output signals, responsive to the single-ended data input signals. As used herein, "uniform" or "equal" delays and impedances are understood to be values with less than an order of magnitude variation.

In one optional aspect, an inverter 316 is connected to the output of the pull-up network on line 206 to accept NOR logic output signals (y), and to supply single-ended OR logic output signals (y_bar) at an output on line 318. It should be noted that the MOSFET transistors can be sized during fabrication to create a desired predetermined impedance when they are enabled or disabled. As shown, MOSFETs 300 and 302 have a relative enabled impedance of 1, MOSFETs 308, 310, 312, and 314 have relative (in transition) impedances of 2, and MOSFETs 304 and 306 have relative enabled impedances of 4. Thus, when MOSFETs 300 and 302 are enabled (a=b=0), their combined impedance is a relative value of 2. Likewise, when MOSFETs 304 and 306 are enabled (a=b=1), there combined impedance is a relative value of 2.

Figure 4:
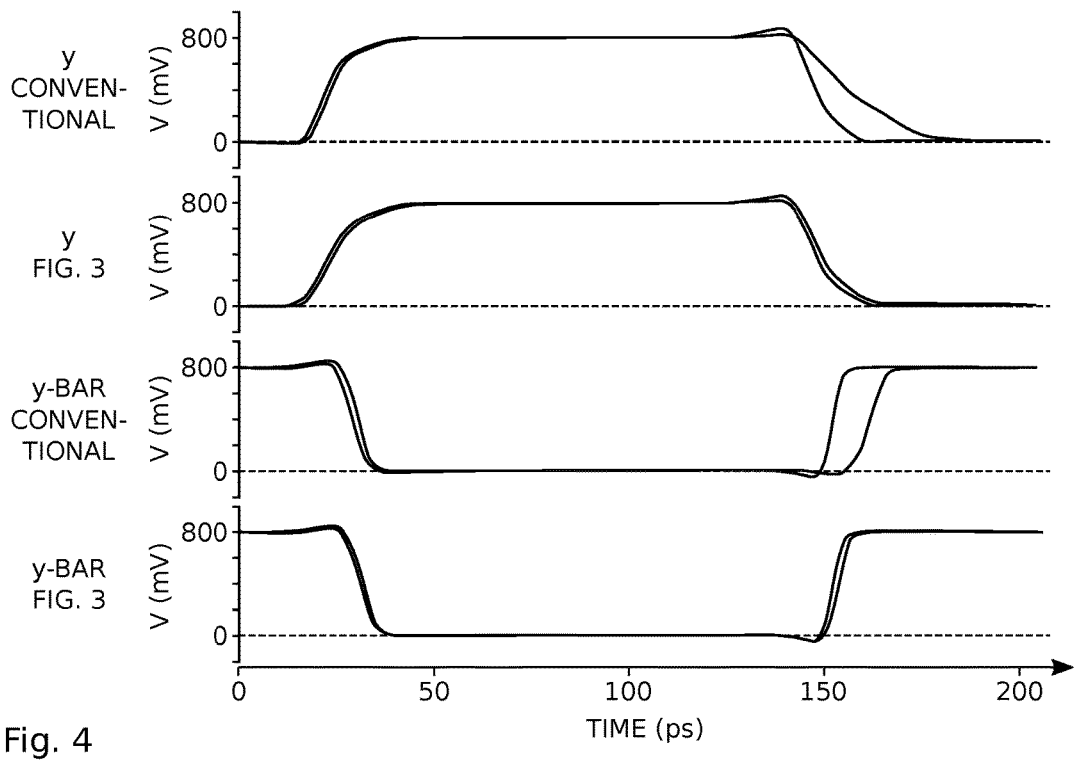
FIG. 4 is a set of graphs depicting the improvement obtained using the logic IC of FIG. 3, in contrast to a conventional data input dependent NOR gate.

FIG. 4 is a set of graphs depicting the improvement obtained using the logic IC of FIG. 3, in contrast to a conventional data input dependent NOR gate. Complementary inputs are often available when dealing with differential signals, and are often a preferred implementation (see FIG. 5, below). In the case where only single-ended inputs are available the pull-down network is dramatically improved, by a factor of 5× using the circuit of FIG. 3. However, the equivalence between resistance loses some significance since the PMOS transistors on the pull-down network are not be active all of the time, but only during the transition period. Nevertheless, appropriate sizing during fabrication can significantly reduce the difference between the logic output fall time transitions. In this case, the fall time delay difference of the y logic output signal is reduced by a factor of 7× from 9.6 picoseconds (ps) to 1.35 ps. This example assumes a frequency of 4 gigahertz (GHz) and data input signal rise times and fall times of 25 picoseconds (ps).

Figure 5:
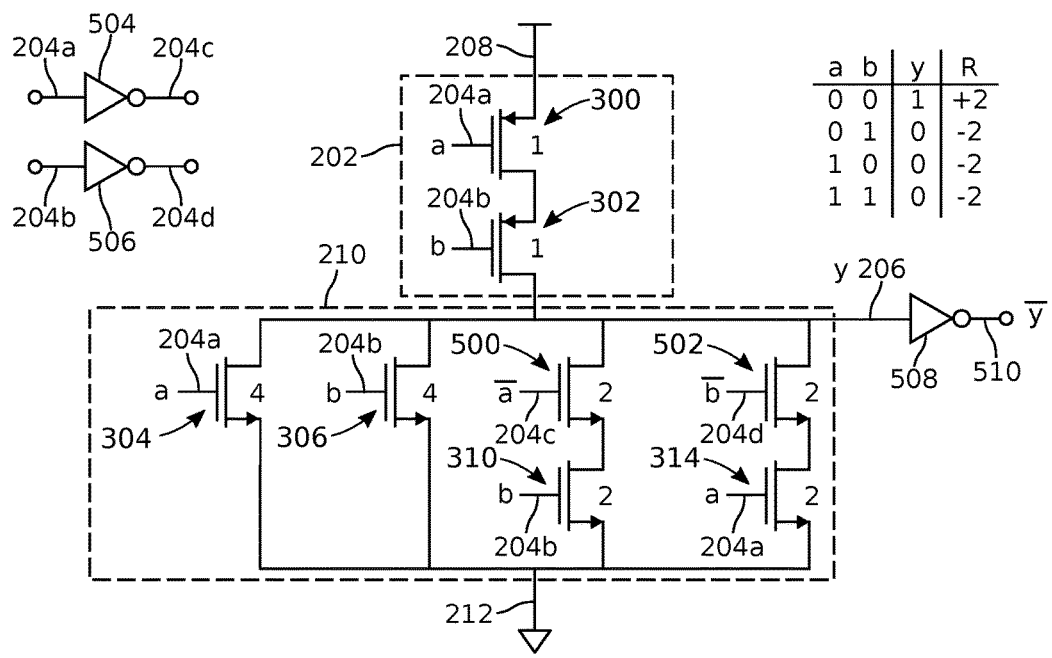
FIG. 5 is a schematic drawing of a complementary input NOR gate with an associated truth table.

FIG. 5 is a schematic drawing of a complementary input NOR gate with an associated truth table. As is FIG. 3, The pull-up network 202 comprises a first PMOS 300 having a first S/D connected to the first reference voltage on line 208, a gate to accept a first non-inverted complementary data input signal (a) on line 204a, and a second S/D. A second PMOS 302 has a first S/D connected to the second S/D of the first PMOS, a gate to accept a second non-inverted complementary data input signal (b) 204b, and a second S/D connected to the output on line 206 to supply NOR logic output signals.

The pull-down network 210 comprises a first NMOS 304 with a first S/D connected to the output on line 206, a gate to accept the first non-inverted complementary data input signal on line 204a, and a second S/D connected to the second reference voltage on line 212. A second NMOS 306 has a first S/D connected to the output on line 206, a gate to accept the second non-inverted complementary data input signal on line 204b, and a second S/D connected to the second reference voltage on line 212. A third NMOS 500 has a first S/D connected to the output on line 206, a gate to accept a first inverted complementary data input signal (a_bar) on line 204c, and a second S/D. Note that the first data input signal on line 204a is converted to the inverted first data input signal on line 204c using inverter 504. A fourth NMOS 310 has a first S/D connected to the second S/D of the third NMOS, a gate to accept the second non-inverted complementary data input signal on line 204b, and a second S/D connected to the second reference voltage on line 212. A fifth NMOS 502 has a first S/D connected to the output on line 206, a gate to accept a second inverted complementary data input signal (b_bar) on line 204d, and a second S/D. Note that the second data input signal on line 204b is converted to the inverted second data input signal on line 204d using inverter 506. A sixth NMOS 314 has a first S/D connected to the second S/D of the fifth NMOS, a gate to accept the first non-inverted complementary data input signal on line 204a, and a second S/D connected to the second reference voltage on line 212. The pull-down network 210 creates uniform fall time delays in the logic output signals, responsive to the complementary data input signals.

An inverter 508 is connected to the output of the pull-up network on line 206 to accept logic output signals (y), and it has an output on line 510 to supply complementary binary level digital logic output signals (y_bar). The combination of the (y) logic output signals on line 206 and (y_bar) logic output signals on line 410 may be interpreted as either complementary OR logic output signals or complementary NOR logic output signals depending on the assignment of y and y_bar designations to lines 206 and 510.

Figure 1:
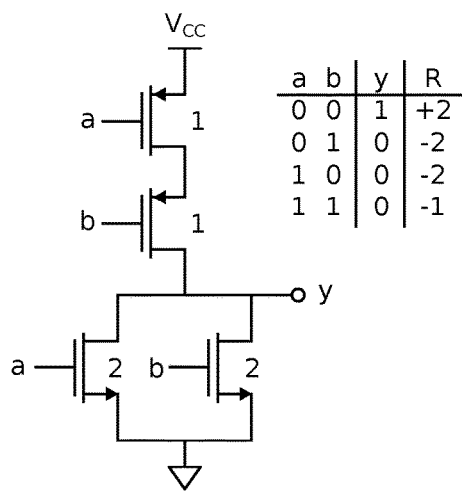
FIG. 1 depicts a CMOS NOR gate and associated truth table (prior art).

In contrast to a logic gate such as shown in FIG. 1, the circuits of FIGS. 3 and 5 add extra pull-down logic to make the fall time equal for all possible combinations. As shown in FIG. 5, complementary inputs are used to balance the pull-down network 210 to create the same relative resistance as the pull-up network 202.

Figure 6:
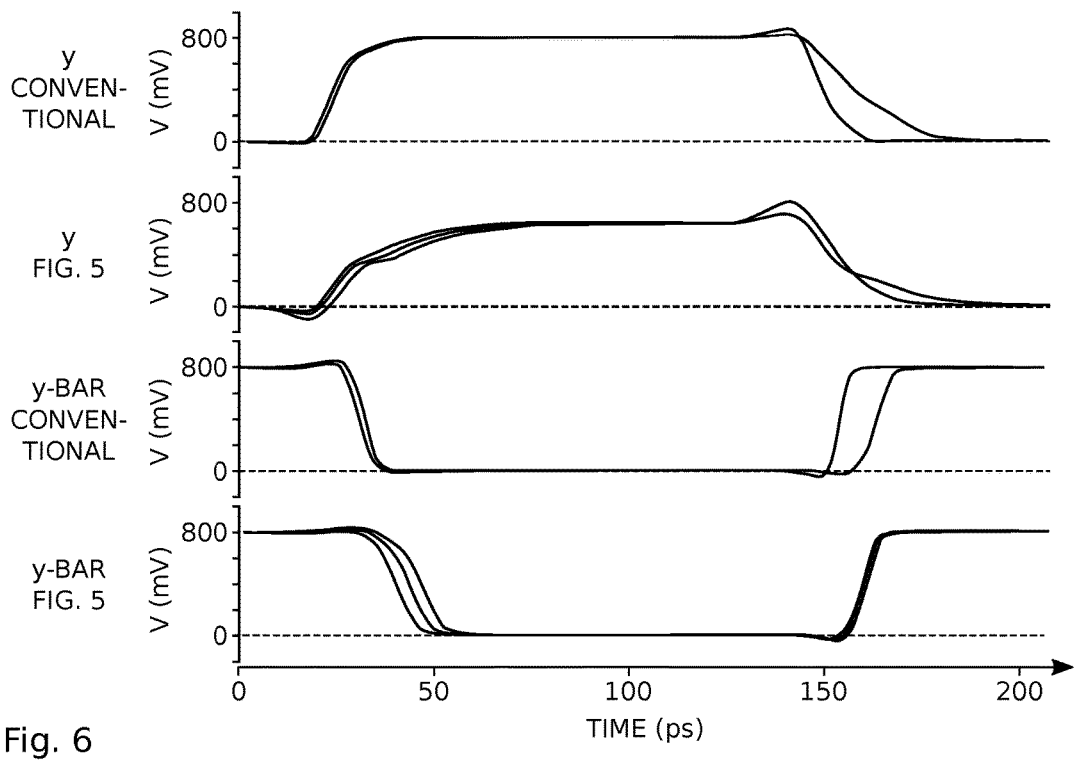
FIG. 6 is a set of graphs depicting the improvement obtained using the logic IC of FIG. 5, in contrast to a conventional data input dependent NOR gate.

FIG. 6 is a set of graphs depicting the improvement obtained using the logic IC of FIG. 5, in contrast to a conventional data input dependent NOR gate. Shown are outputs y and y_bar, which is buffered by an inverter. In this example, the data input signals "a" and "b" have a frequency of 4 GHz, with rise times and fall times of 25 ps. With a conventional NOR gate, the differences in the delay of the y_bar logic output signals is 9.6 ps, while the NOR gate logic output signals of FIG. 5 have a delay difference of only 1 ps—a 10× improvement.

Figure 7A:
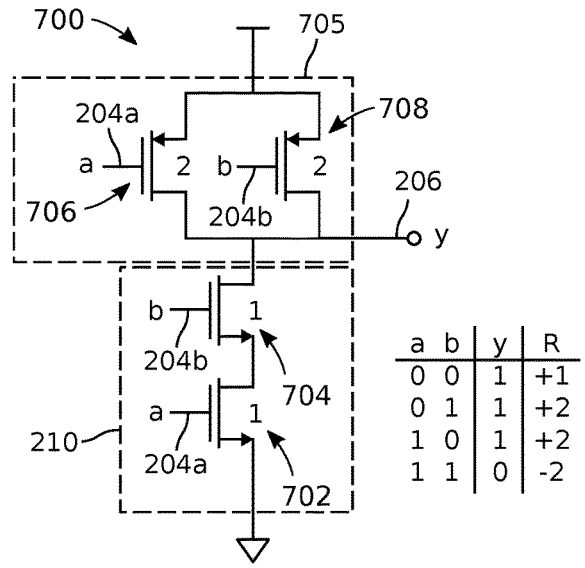
FIGS. 7A (prior art) and 7B respectively depict schematic drawings, and associated truth tables, of a conventional single-ended input NAND gate in contrast to a NAND gate having a delay independent of the data input values.

FIGS. 7A (prior art) and 7B respectively depict schematic drawings, and associated truth tables, of a conventional single-ended input NAND gate in contrast to a NAND gate having a delay independent of the data input values. More explicitly, the pull up network transistors have a uniform impedance while in transition being enabled. In FIG. 7A the conventional NAND gate 700 pull-down network 210 comprises a first NMOS 702 having a first S/D connected to the output on line 206, a gate to accept a first single-ended data input signal (a) on line 204a, and a second S/D. A second NMOS 704 has a first S/D connected to the second S/D of the first NMOS 702, a gate to accept a second single-ended data input signal (b) 204b, and a second S/D connected to the second reference voltage. The pull-up network 705 comprises a first PMOS 706 having a first S/D connected to the first reference voltage, a gate to accept a first single-ended data input signal (a) on line 204a, and a second S/D connected to the output on line 206. A second PMOS 708 has a first S/D connected to the first reference voltage, a gate to accept a second single-ended data input signal (b) 204b, and a second S/D connected to the output on line 206. As can be seen from the truth table, the relative resistance through the pull-up network, when the data input values are both zero, is less than the resistance through the pull-down network, resulting in a difference in the logic output signal rise time delay.

Figure 7B:
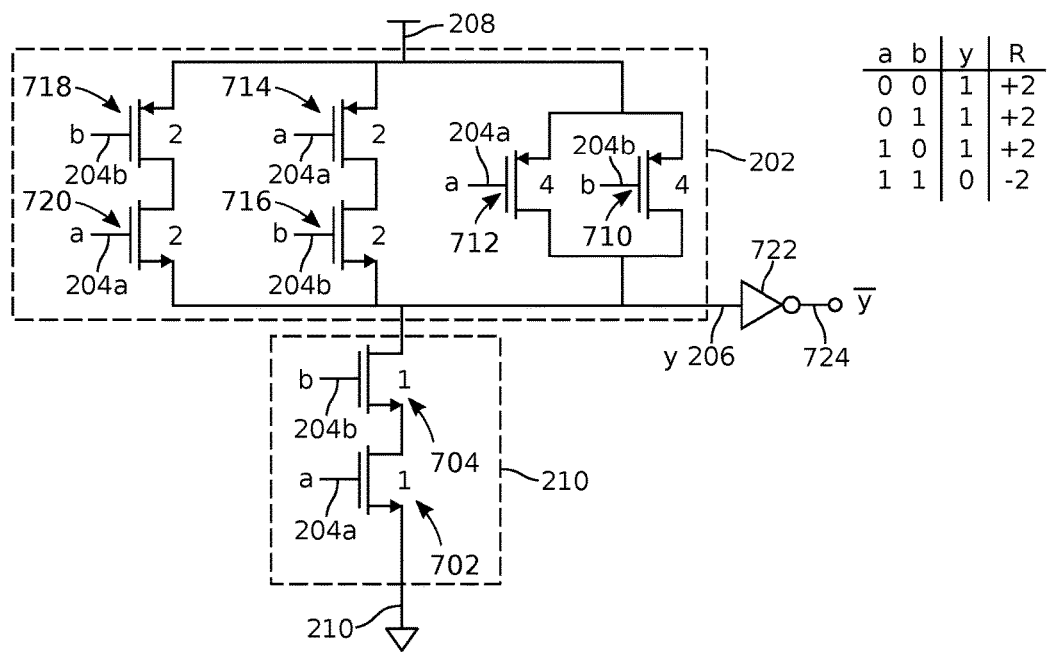

The NAND gate of FIG. 7B uses the same pull-down network 210 as the conventional circuit of FIG. 7A, comprising a first NMOS 702 having a first S/D connected to the output on line 206, a gate to accept a first single-ended data input signal (a) on line 204a, and a second S/D. A second NMOS 704 has a first S/D connected to the second S/D of the first NMOS 702, a gate to accept a second single-ended data input signal (b) 204b, and a second S/D connected to the second reference voltage on line 212.

The pull-up network 202 comprises a first PMOS 710 with a first S/D connected to the first reference voltage on line 208, a gate to accept the second data input signal on line 204b, and a second S/D connected to the output on line 206. A second PMOS 712 has a first S/D connected to the first reference voltage on line 208, a gate to accept the first data input signal on line 204a, and a second S/D connected to the output on line 206. A third PMOS 714 has a first S/D connected to the first reference voltage on line 208, a gate to accept the first data input signal on line 204a, and a second S/D. A third NMOS 716 has a first S/D connected to the second S/D of the third PMOS 714, a gate to accept the second data input signal on line 204b, and a second S/D connected to the output on line 206. A fourth PMOS 718 has a first S/D connected to the first reference voltage on line 208, a gate to accept the second data input signal on line 204b, and a second S/D. A fourth NMOS 720 has a first S/D connected to the second S/D of the fourth PMOS 718, a gate to accept the first data input signal on line 204a, and a second S/D connected to the output on line 206. The pull-up network creates uniform rise time delays in the logic output signals, responsive to the single-ended data input signals.

Optionally, an inverter 722 is connected to the output of the pull-up network on line 206 to accept logic output signals (y), and it has an output on line 724 to supply single-ended AND logic output signals (y_bar).

Figure 8:
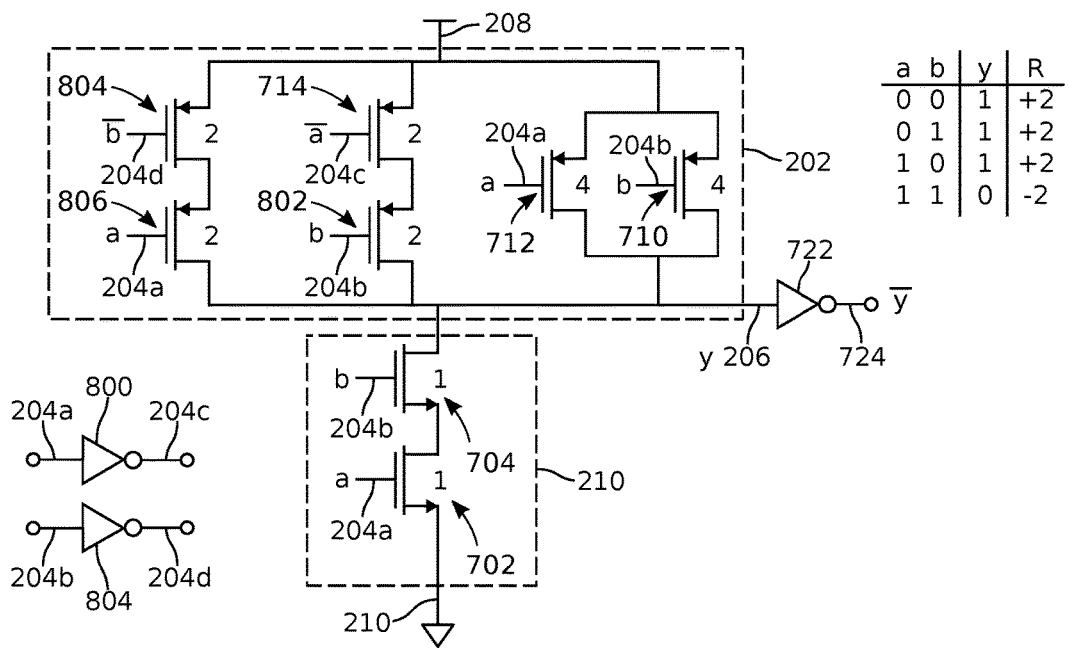
FIG. 8 is a schematic drawing of a complementary input NAND gate with an associated truth table.

FIG. 8 is a schematic drawing of a complementary input NAND gate with an associated truth table. As in FIGS. 7A and 7B, the pull-down network 210 comprises a first NMOS 702 having a first S/D connected to the output on line 206, a gate to accept a first non-inverted complementary data input signal (a) on line 204a, and a second S/D. A second NMOS 704 has a first S/D connected to the second S/D of the first NMOS 702, a gate to accept a second non-inverted complementary data input signal (b) 204b, and a second S/D connected to the second reference voltage on line 212.

The pull-up network 202 comprises a first PMOS 710 with a first S/D connected to the first reference voltage on line 208, a gate to accept the non-inverted complementary second data input signal on line 204b, and a second S/D connected to the output on line 206. A second PMOS 712 has a first S/D connected to the first reference voltage on line 208, a gate to accept the non-inverted complementary first data input signal on line 204a, and a second S/D connected to the output on line 206. A third PMOS 714 has a first S/D connected to the first reference voltage on line 208, a gate to accept an inverted complementary first data input signal (a_bar) on line 204c, and a second S/D. Note that inverter 800 has an input to accept the non-inverted complementary first data input signal (a) on line 204 to supply the inverted complementary data input signal on line 204c. A fourth PMOS 802 has a first S/D connected to the second S/D of the third PMOS 714, a gate to accept the non-inverted second complementary data input signal on line 204b, and a second S/D connected to the output on line 206. A fifth PMOS 804 has a first S/D connected to the first reference voltage on line 208, a gate to accept an inverted complementary second data input signal (b_bar) on line 204d, and a second S/D. A sixth PMOS 806 has a first S/D connected to the second S/D of the fifth PMOS 804, a gate to accept the non-inverted complementary first data input signal on line 204a, and a second S/D connected to the output on line 206. The pull-up network creates uniform rise time delays in the logic output signals, responsive to the complementary data input signals.

In one aspect, an inverter 808 is connected to the output of the pull-up network on line 206 to accept logic output signals (y), and has an output on line 810 to supply complementary binary level digital logic output signals (y_bar). The combination of the (y) and (y_bar) logic output signals may be interpreted as either complementary AND logic output signals or complementary NAND logic output signals by switching the y and y_bar designations.

Figure 9:
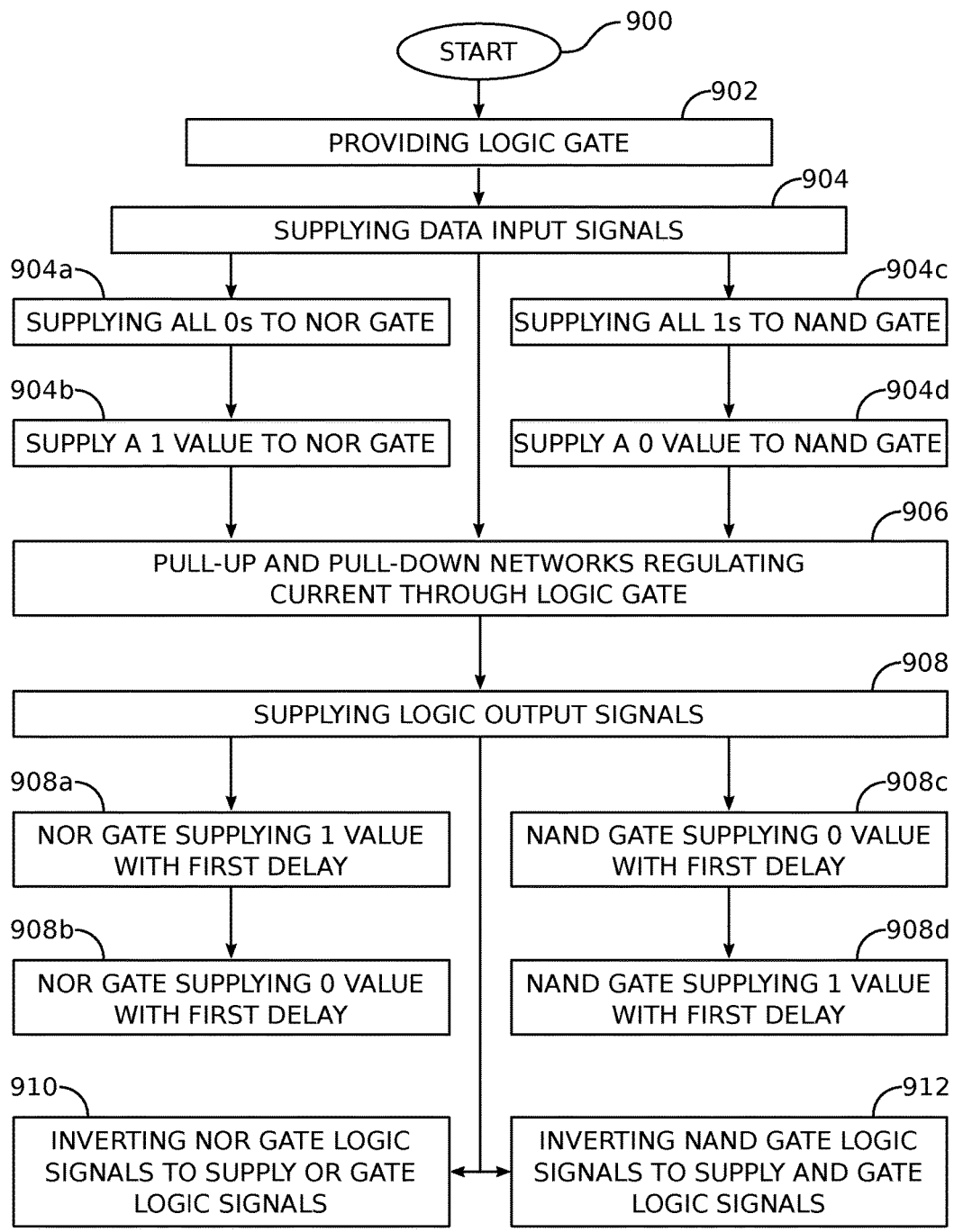
FIG. 9 is a flowchart illustrating a method for supplying logic signals with a data-independent delay.

FIG. 9 is a flowchart illustrating a method for supplying logic signals with a data-independent delay. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps and is associated with FIGS. 2-3, 5, 7B, and 8. The method starts at Step 900.

Step 902 provides a logic gate comprising a pull-up network connected to a pull-down network. That is, the pull-up network and pull-down network each may have an impedance, when enabled, independent of the data signals. For example, the logic gate may be one of the following: NOR gate, OR gate, AND gate, or NAND gate. Step 904 supplies binary level digital data input signals to the pull-up network and pull-down network, which may be either single-ended or complementary data signals. In Step 906 the pull-up network and pull-down network regulate current through the logic gate with a delay independent of the data signals. In Step 908 the logic gate supplies binary level digital logic output signals in response to the data signals, with a uniform delay.

In one aspect, Step 902 provides a NOR gate and Step 904a supplies all zero value data input signals at a first time. Then, in Step 908a the NOR gate supplies a one value logic output signal with a first fall time delay after the first time. When Step 904b supplies at least a single one value data input signal, or two one values, at a second time, the NOR gate supplies a zero value logic output signal with the first fall time delay after the second time in Step 908b. In a different aspect, Step 910 inverts the NOR gate logic output signals to supply OR gate logic output signals with the above-mentioned uniform delay, independent of the data signals.

In another aspect, Step 902 provides a NAND gate, and Step 904c supplies all one value data input signals at a first time. Then, in Step 908c the NAND gate supplies a zero value logic output signal with a first rise time delay after the first time. When Step 904d supplies at least a single zero value data input signal, or two zero values, at a second time, the NAND gate supplies a one value logic output signal with the first rise time delay after the second time in Step 908d. In a different aspect, Step 912 inverts the NAND gate logic output signals to supply AND gate logic output signals with the above-mentioned uniform delay, independent of the data signals.

Figure 10A:
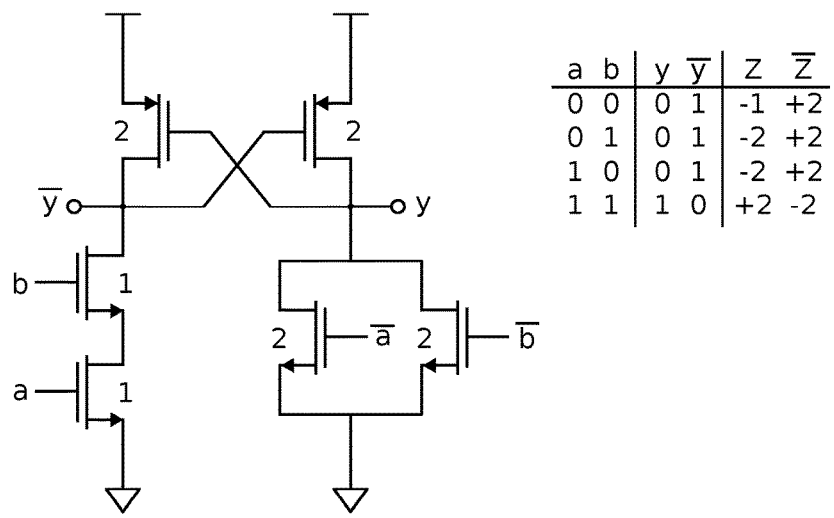
FIGS. 10A (prior art) and 10B respectively depict schematic drawings, and associated truth tables, of a conventional complementary differential cascode voltage switch logic (DCVSL) AND gate and DCVSL AND gate having a delay independent of the data input values.
Figure 10B:
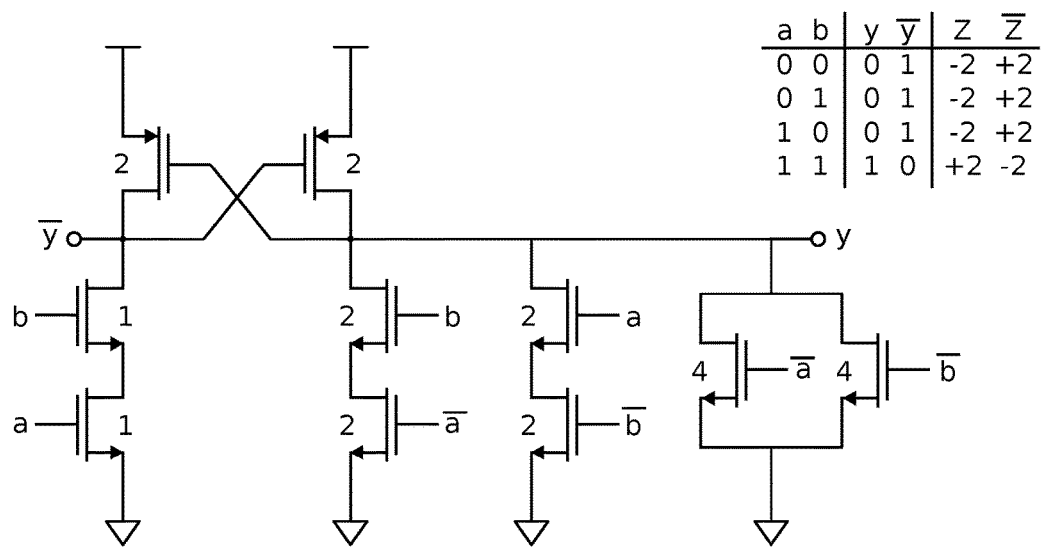

FIGS. 10A (prior art) and 10B respectively depict schematic drawings, and associated truth tables, of a conventional complementary differential cascode voltage switch logic (DCVSL) AND gate and DCVSL AND gate having a delay independent of the data input values. Note that "Z" refers to the impedance of the pull-up network and "Z-bar" refers to the impedance of the pull-down network.

Figure 11A:
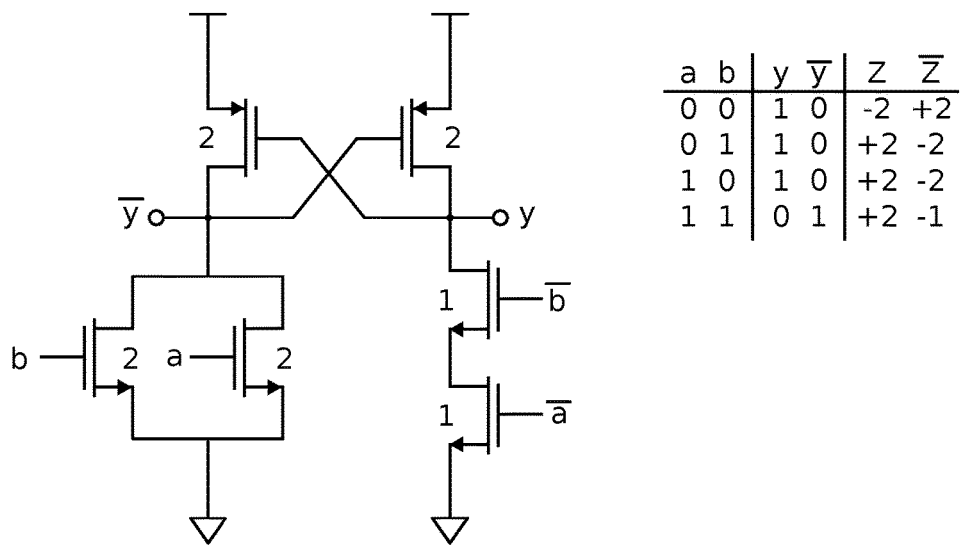
FIGS. 11A (prior art) and 11B respectively depict schematic drawings, and associated truth tables, of a conventional DCVSL OR gate and DCVSL OR gate having a delay independent of the data input values.
Figure 11B:
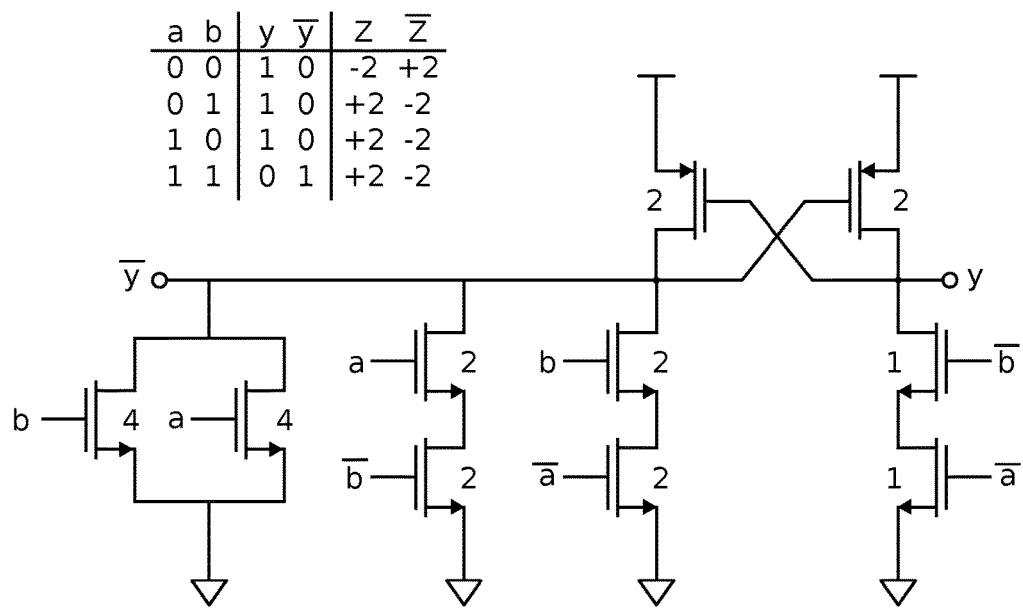

FIGS. 11A (prior art) and 11B respectively depict schematic drawings, and associated truth tables, of a conventional DCVSL OR gate and DCVSL OR gate having a delay independent of the data input values.

Logic gates have been presented with pull-up and pull-down networks have uniform impedances that are independent of the data input signals, resulting in the logic output signals having a uniform delay.

Examples of circuit technologies have been presented to illustrate the invention. However, the invention is not limited to merely these examples. Other variations and embodiments of the invention will occur to those skilled in the art.

I claim:
1. A NOR logic integrated circuit (IC) with data-independent delay, the NOR logic IC comprising:
   a pull-up network having an input to accept binary level digital data input signals, an output to supply binary level digital logic output signals responsive to the data input signals, and a current interface connected to a first reference voltage;
   a pull-down network having an input to accept the data input signals, a current interface connected to a second reference voltage having a lower potential than the first reference voltage, and an output connected to the output of pull-up network;
   wherein the pull-up network comprises:
      a first p-channel metal-oxide-semiconductor field-effect transistor (PMOS) having a first source/drain (S/D) connected to the first reference voltage, a gate to accept a first single-ended data input signal (a), and a second S/D;
      a second PMOS having a first S/D connected to the second S/D of the first PMOS, a gate to accept a second single-ended data input signal (b), and a second S/D connected to the output to supply NOR logic signals;
   wherein the pull-down network comprises:
      a first n-channel metal-oxide-semiconductor field-effect transistor (NMOS) with a first S/D connected to the output, a gate to accept the first single-ended data input signal, and a second S/D connected to the second reference voltage;

a second NMOS with a first S/D connected to the output, a gate to accept the second single-ended data input signal, and a second S/D connected to the second reference voltage;

a third PMOS with a first S/D connected to the output, a gate to accept the first single-ended data input signal, and a second S/D;

a third NMOS with a first S/D connected to the second S/D of the third PMOS, a gate to accept the second single-ended data input signal, and a second S/D connected to the second reference voltage;

a fourth PMOS with a first S/D connected to the output, a gate to accept the second single-ended data input signal, and a second S/D;

a fourth NMOS with a first S/D connected to the second S/D of the fourth PMOS, a gate to accept the first single-ended data input signal, and a second S/D connected to the second reference voltage;

wherein the pull-down network creates uniform fall time delays in the logic output signals, responsive to the single-ended data input signals, and, wherein the pull-up network and the pull-down network maintain a uniform impedance between their respective outputs and current interfaces, independent of the data input signals, when enabled.

2. The NOR logic IC of claim 1 further comprising:
an inverter connected to the output of the pull-up network to accept NOR logic output signals (y), and having an output to supply single-ended OR logic output signals (y_bar).

3. The NOR logic IC of claim 2 wherein the combination of the (y) and (y_bar) logic output signals are interpreted as logic output signals selected from the group consisting of complementary OR logic output signals or complementary NOR logic output signals.

4. A NOR logic integrated circuit (IC) with data-independent delay, the NOR logic IC comprising:
a pull-up network having an input to accept binary level digital data input signals, an output to supply binary level digital logic output signals responsive to the data input signals, and a current interface connected to a first reference voltage;

a pull-down network having an input to accept the data input signals, a current interface connected to a second reference voltage having a lower potential than the first reference voltage, and an output connected to the output of pull-up network;

wherein the pull-up network comprises:

a first PMOS having a first S/D connected to the first reference voltage, a gate to accept a first non-inverted complementary data input signal (a), and a second S/D; and, a second PMOS having a first S/D connected to the second S/D of the first PMOS, a gate to accept a second non-inverted complementary data input signal (b), and a second S/D connected to the output to supply NOR logic output signals:

wherein the pull-down network comprises:

a first NMOS with a first S/D connected to the output, a gate to accept the first non-inverted complementary data input signal, and a second S/D connected to the second reference voltage;

a second NMOS with a first S/D connected to the output, a gate to accept the second non-inverted complementary data input signal, and a second S/D connected to the second reference voltage;

a third NMOS with a first S/D connected to the output, a gate to accept a first inverted complementary data input signal (a_bar), and a second S/D;

a fourth NMOS with a first S/D connected to the second S/D of the third NMOS, a gate to accept the second non-inverted complementary data input signal, and a second S/D connected to the second reference voltage;

a fifth NMOS with a first S/D connected to the output, a gate to accept a second inverted complementary data input signal (b_bar), and a second S/D;

a sixth NMOS with a first S/D connected to the second S/D of the fifth NMOS, a gate to accept the first non-inverted complementary data input signal, and a second S/D connected to the second reference voltage;

wherein the pull-down network creates uniform fall time delays in the logic output signals, responsive to the complementary data input signals; and, wherein the pull-up network and the pull-down network maintain a uniform impedance between their respective outputs and current interfaces, independent of the data input signals, when enabled.

5. The NOR logic IC of claim 4 further comprising:
an inverter connected to the output of the pull-up network to accept logic output signals (y), and having an output to supply single-ended binary level digital logic output signals (y_bar).

6. The NOR logic IC of claim 5 wherein the combination of the (y) and (y_bar) logic output signals are interpreted as logic output signals selected from the group consisting of complementary OR logic output signals or complementary NOR logic output signals.

* * * * *